(12) United States Patent
Blain et al.

(10) Patent No.: US 6,598,610 B2
(45) Date of Patent: Jul. 29, 2003

(54) METHOD OF DEPOSITING A THICK DIELECTRIC FILM

(75) Inventors: Stephane Blain, Sherbrooke (CA); Sylvie Harrison, Brigham (CA)

(73) Assignee: DALSA Semiconductor Inc., Waterloo (CA)

( * ) Notice: Subject to any disclaimer, the term of this patent is extended or adjusted under 35 U.S.C. 154(b) by 104 days.

(21) Appl. No.: 09/775,465

(22) Filed: Feb. 5, 2001

(65) Prior Publication Data
US 2002/0106459 A1 Aug. 8, 2002

(51) Int. Cl.$^7$ .............................................. C23C 16/40

(52) U.S. Cl. ..................... 134/1.1; 134/22.1; 427/579; 427/255.37; 427/255.7

(58) Field of Search ............................... 134/1.1, 22.1; 427/255.7, 255.37, 579

(56) References Cited

U.S. PATENT DOCUMENTS 5,252,178 A    10/1993  Moslehi
6,067,999 A  *  5/2000  Hines et al. ................... 134/1

FOREIGN PATENT DOCUMENTS

EP    0 464696    8/1992

OTHER PUBLICATIONS

Suzuki S., Polarization insensitive arrayed–waveguide gratings using dopant–silica based glass with thermal coefficient adjusted to silicon substrate, Electron. Lett. 33(13), 1173, 1997.
Takahashi H., Polarization insensitve arrayed waveguide wavelength multiplexer with birefringence compensating film, IEEE Photon. Tech.Lett. 5(6),707,1993.
Verbeek B., Integrated four–channel Mach–Zehnder multi–demultiplexer fabricated with phosphorus doped SiO2 waveguides on Si, J.Lightwave tech., 6(6), 1011, 1988.
Henry C., Four–channel wavelength division multiplexers and bypass filters on elliptical Bragg reflectors, J.Lightwave tech., 8(5), 748, 1990.
Adar R., Less then 1dB per meter propagation loss of silica Waveguides measured using a ring oscillator, J.Lightwave tech., 12(8), 1369, 1994.
Imoto K., Silica Glass waveguide structure and its implication to a multi/demultiplexer, ECOC, 577, 1988.
Imoto K., Highsilica guided–wave optical devices, 41st ECTC,483, 1991.
Bruno F., Plasma–enhanced chemical vapor deposition of low–loss SiON optical waveguides at 1.5–um wavelength, Applied Optics, 30(31), 4560, 1991.
Lai Q., Simple technologies for fabrication of low–loss silica waveguides, Elec. Lett., 28(11), 1000, 1992.
Tu Y., Single–mode SiON/SiO2/Si optical waveguides prepared by plasma–enhanced chemical vapor deposition, Fiber and integrated optics, 14, 133, 1995.
Grand G., Low–loss PECVD silica channel waveguides for optical communications, Electron.Lett., 26(25), 2135, 1990.
Hoffmann M., Low–temperature, nitrogen doped waveguides on silicon with small core dimensions fabricated by PECVD/RIE, ECIO'95, 299, 1995.
Hoffmann M., Low–loss fiber–matched low–temperature PECVD waveguides with small core dimensions for optical communication systems, IEEE Photonics Tech.Lett., 9(9), 1238, 1997.

(List continued on next page.)

Primary Examiner—Timothy Meeks
(74) Attorney, Agent, or Firm—Marks & Clerk

(57) ABSTRACT

Thick dielectric films are deposited on a substrate by building up a plurality of layers by PECVD (Plasma Enhanced Chemical Vapor Deposition) in a reactor, each layer having a thickness less than the final thickness of the film to be deposited. The reactor is cleaned between the deposition of each layer. In this way, it is possible to form high quality, optical films.

13 Claims, 1 Drawing Sheet

OTHER PUBLICATIONS

Pereyra I., High quality low temperature DPECVD silicon dioxide, J. Non–Crystalline Solids, 212, 225, 1997.

Alayo M., Thich SiOxNy and SiO2 films obtained by PECVD technique at low temperatuers, Thin Solid Films, 332, 40, 1998.

Bulla D., Deposition of thick TEOS PECVD silicon oxdie layers for integrated optical waveguide applications, Thin Solid Films, 334, 60, 1998.

Worhoff K., Plasma enhanced chemical vapor deposition silicon or oxynitride optimized for application in integrated optics, Sensors and Actuators, 74, 9, 1999.

* cited by examiner

METHOD OF DEPOSITING A THICK DIELECTRIC FILM

FIELD OF THE INVENTION

This invention relates to a method of depositing a thick dielectric film, such a silica film, of optical quality on a substrate.

The manufacture of optical devices, such as optical Multiplexers (Mux) and Demultiplexers (DMux), using silica wave guides, requires the deposition of high performance silica films over a silicon wafer. Because of the stringent requirements on the different characteristics of these films, it is important to have very good control (within wafer uniformity, wafer to wafer and run to run reproducibility) over the required physico-chemical and mechanical characteristics.

The most important characteristics to control are the film composition, refractive index, mechanical stress and optical absorption. In addition, the film has to be free of any particles or other contamination. Such particles can act as light absorption sites or introduce defects in the functionality of the device.

BACKGROUND OF THE INVENTION

The deposition of a thick dielectric layer for optical and micro mechanical devices can be performed using the LPCVD (Low Pressure Chemical Vapor Deposition) technique. This technique deposits the dielectric layer through the introduction of reactive gases into a low-pressure quartz furnace. This reaction is activated by heat only, and the uniformity and reproducibility of the layer depends on different parameters, such as film buildup on the wall of the furnace, temperature profile, quartz ware and gas dynamics in the furnace, which are difficult to control. This technique produces a film with a large number of small size contaminants. These contaminants increase in size with the thickness of the film.

The deposition can also be carried out using the APCVD (Atmospheric Pressure Chemical Vapor Deposition) technique. In this technique, the layer is deposited by injection of reactive gases from a dispersion head to the heated substrate. The deposition of a thick layer in such equipment requires multiple separate depositions and it is difficult to control the reproducibility of the film from one deposition to another. Also, the contamination level of such a deposition technique is high because of the direct contact between the reactive gases and the atmosphere.

SUMMARY OF THE INVENTION

In accordance with the principles of the invention, PECVD (Plasma Enhanced Chemical Vapor Deposition) in a commercially available reactor is used for the thick film deposition.

PECVD deposition is normally used for integrated circuit (IC) fabrication where the thickness of films involved is of the order of one micron or less. The deposition of thicker layers is difficult especially for thickness of more than five microns. At these thicknesses, the top electrodes that also act as the gas dispersion head experience overheating by the plasma energy, and the presence of silane ($SiH_4$) in the reactor will cause a silica film buildup on the electrode. This buildup modifies the relative impedance of the plasma and causes a shift in the plasma characteristic and thus in the film characteristics itself. Also, because of the poor adhesion of this silica buildup on the top electrode at an uncontrolled temperature, flakes peel off the surface and fall on the wafer thus creating major contamination. In a sequential deposition reactor, this contamination from the top electrode appears after approximately 200 seconds of continuous deposition under a single showerhead. This limitation on time corresponds to a film of approximately five microns for a deposition rate of 0.215 micron/min that is typical for this process. The overheating of the showerhead can also occur with a thinner film if it is deposited on a large number of wafers. The consecutive deposition of film thicker than one micron will cause overheating that will generate a shift in the film characteristics and contamination. It would thus not be expected that PECVD might be suitable for making optical quality thick films.

The manufacture of optical devices such as optical Mux and DMux using silica wave-guides requires film thickness of 5 to 12 micron for a single layer. The total thickness normally used for a buffer/core/cladding structure is 20 microns or more. At these thicknesses it is not normally possible to deposit films in a single run to obtain the film quality and control needed by integrated optical devices without excessive contamination caused by the top electrode overheating in the reactor.

The present invention permits the production of film of thickness of 20 microns or more processed in a single run for a large number of wafers in the same batch using a special deposition sequence in a commercial reactor.

According to the present invention there is provided a method of depositing thick dielectric films on a substrate, comprising building up said dielectric film by depositing a plurality of layers by PECVD (Plasma Enhanced Chemical Vapor Deposition) in a reactor, each layer having a final thickness less than the thickness of said film to be deposited; and cleaning said reactor between the deposition of each layer.

Using this method the applicants have found unexpectedly that they can deposit dielectric films up to 28 microns or more in a commercially available PECVD reactor without contamination. Such films can be used as high performance optical material.

For example, the multiple step process can be used to deposit a thick layer of silicon dioxide ($SiO_2$) in a manner such as the refractive index, the composition, the mechanical stress are controlled and the contamination of the film is low. This low contamination level leads to minimal light losses when this film is used in a light-propagating device, such as an integrated 'Mux/DMux' on silicon.

Preferably, a cleaning sequence for the reactor is employed that removes film buildup on the gas dispersion head by a combination of high and low pressure plasma clean which is dependant on the thickness of the film to be deposited and the number of wafers to be processed. A key aspect of the invention is the provision of a cleaning sequence that can be made dependent on the maximum number of wafers to be processed for a particular thickness before a plasma clean is required. The cleaning sequence is carried out automatically and the deposition sequence continues in the same run to guarantee good reproducibility from wafer to wafer.

Typically, the high pressure clean is carried out at about 2.7 Torr, and the low pressure clean at about 0.7 Torr.

BRIEF DESCRIPTION OF THE DRAWINGS

The invention will now be described in more detail, by way of example only, with reference to the accompanying drawings, in which.

DETAILED DESCRIPTION OF THE PREFERRED EMBODIMENTS

Figure 1:
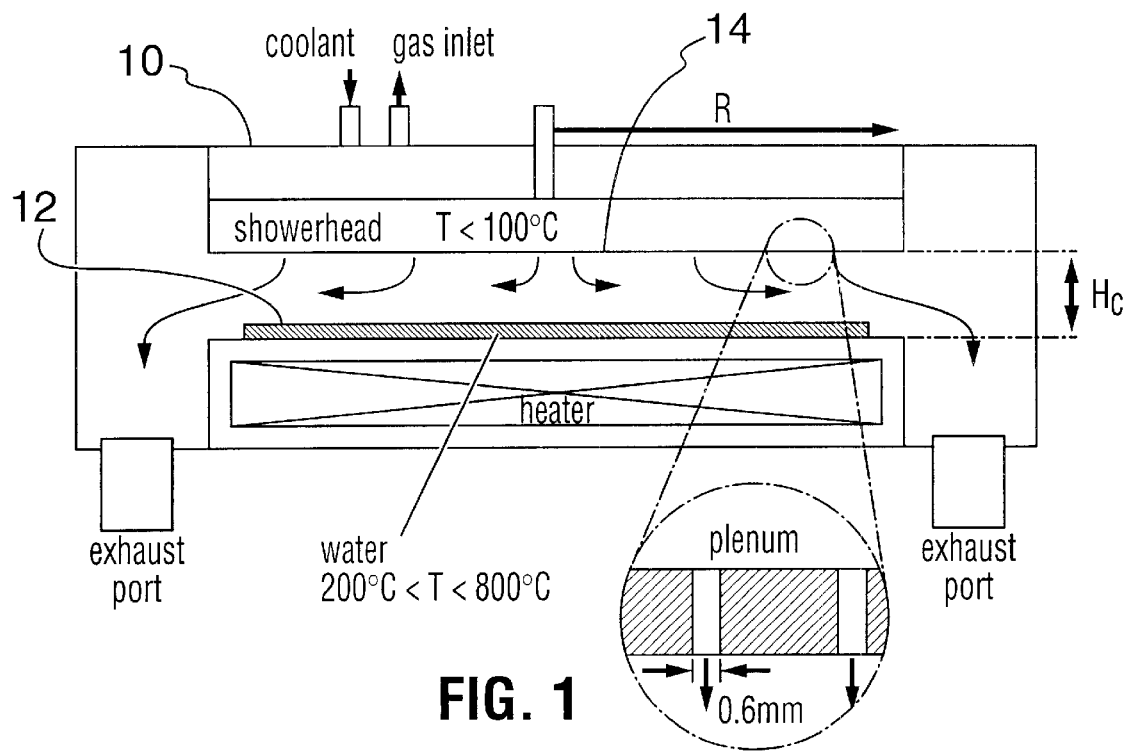
FIG. 1 is a schematic diagram of a showerhead PECVD reactor.

The invention is preferably implemented using a showerhead reactor of the type show in FIG. 1. The showerhead reactor 10 employs a perforated or porous planar surface 14, forming the showerhead, to dispense reactant gases more-or-less uniformly over a second parallel planar surface 12, which can support a batch of wafers on which a film is to be deposited. More than one showerhead may be provided in a reactor.

Figure 2:
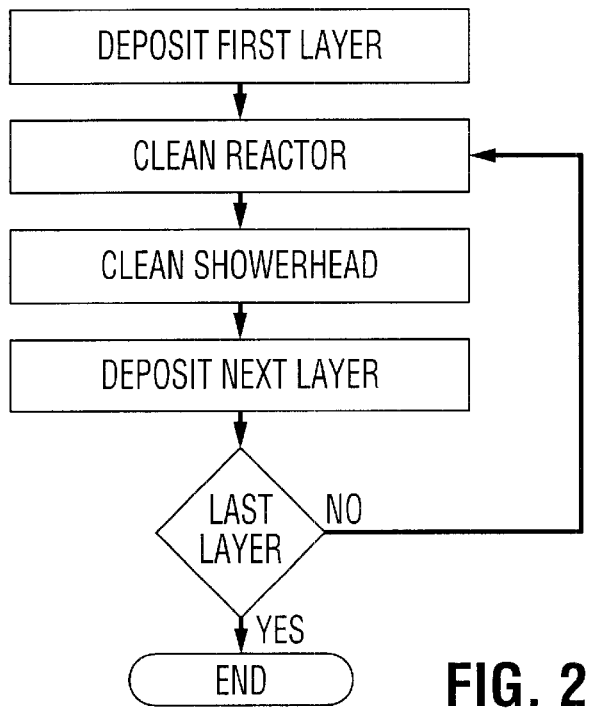
FIG. 2 is a flow chart showing the operation of the process in accordance with the invention.

The method in accordance with one embodiment of the invention is shown in FIG. 2. After deposition of the first sublayer, the reactor is plasma cleaned with oxygen and an etchant. The showerhead itself is cleaned to remove buildup of film, and then the next sublayer is deposited. This process is repeated until the complete film thickness has been built up.

EXAMPLE

A layer thicker than 7 microns on a large number of wafers can be deposited as follows:

First a substrate is placed in a commercial sequential PECVD showerhead reactor, which is set to deposit the complete film in the multilayer mode. Each of the sublayers deposited should be half of the required final thickness up to 14 microns, one third up to 21 microns, one quarter up to 28 microns. The number of sublayers needed corresponds to the minimum number of sublayers necessary to build up the full thickness of the film without exceeding 7 microns for each sublayer. As an example, the buffer layer of a Mux/DMux could be deposited in two sublayers of 4 $\mu$m each. The core layer (5 $\mu$m) and the cladding layer can be deposited in a single deposition.

The plasma reactor must be cleaned between each of the deposited sublayers. This complete reactor clean is carried out by a combination of two steps. The first step is generally a high-pressure clean intended to etch all the components in the reactor. In this first cleaning step, the plasma will occupy the whole volume of the reactor. The second cleaning step is a low-pressure clean intended to etch the gas dispersion showerhead alone and remove any potential film buildup that can cause contamination in the next layer deposition. This sequence also allows the showerheads to come back to a stable temperature before continuing the deposition with the next layer.

The cleaning steps are carried out with oxygen and an etchant, for example, $C_2F_6$.

Typical parameters for these cleaning steps are as follows:
High pressure clean (A):
  Pressure: 2.7 Torr
  RF Power: 1000 Watt
  $O_2$ flow: 2 slm (standard liter per minute)
  $C_2F_6$ flow: 2 slm
  Time: deposited thickness×0.35
Low pressure clean (B):
  Pressure: 0.7 Torr
  RF Power: 1000 Watt
  $O_2$ flow: 2 slm (standard liter per minute)
  $C_2F_6$ flow: 2 slm
  Time: 0.25×clean A time+150 sec In order to calculate the deposited thickness for use in the calculation of the time of clean A, a recipe dependant deposition rate should be used, which also takes into account the number of wafers to be deposited and the time of the deposition. To avoid contamination, the applicants have found that the nominal deposition rates used in the calculation of the cleaning time should be adjusted to 5000 A/min, which is higher than the actual value of 4100 A/min. This will cause the reactor to go into the cleaning mode before peeling from the showerhead can happen by overestimating the real thickness as a function of the number of wafers to be deposited.

To calculate the etch time for cleaning step B, a recipe dependant etch rate should be used. To avoid contamination the nominal etch rate should be adjusted to 8000 A/min, which is lower than the real value of 11000 A/min. This will cause the plasma clean to stay in an over-etching mode for a longer time as a function of the thickness and the number of wafers to be deposited.

With this method in place, it is possible to deposit multi-layer structures without limitation on the thickness to be deposited or the number of wafers to be processed since the reactor is cleaned during deposition of the layers taking into account the thickness of the film and the number of wafers to be processed.

The parameters can be varied to suit the particular circumstances. Typically, the pressure in cleaning step A can be varied from 1 Torr to 10 Torr, the pressure in cleaning step B can be varied from 1 Torr to 10 Torr, the RF power during cleaning steps A and B can be varied from 500 W to 5000 W, the oxygen flow in cleaning steps A and B can be varied from 0.5 slm to 10 slm, the $C_2F_6$ flow in steps A and B can be varied from 0.5 slm to 10 slm, the maximum thickness to be deposited in a single layer can be varied from 1 $\mu$m to 10 $\mu$m, the maximum number of sublayers in a single run can be varied from 1 to 10, the deposition rate setting for clean time calculation can be varied from 4000 A/min to 10000 A/min, and the etch rate setting for clean time calculation can be varied from 11000A/min to 1000 A/min.

The invention is applicable to manufacturing processes involving the deposition of thick (thicker than 1 micron) layers. Apart from plain silica, such layers could be doped silica, nitride, oxynitride, or amorphous silicon.

The films can be formed onto substrates such as silicon wafers, III-V compound semiconductor wafers, II-VI compound semiconductor wafers, quartz, saphire, and alumina.

The invention is particularly applicable to the manufacture of photonic devices, such as Mux/DMux devices, but it is also applicable to semiconductor devices in general, Micro Electro Mechanical Systems (MEMS), bio-chips, Lab-on-a-chip devices; and Multi-chip modules. For example, another important application is in the manufacture of rotating mirrors for optical switches.

What is claimed is:

1. A method of depositing a thick dielectric film on a substrate, comprising:

building up said dielectric film by sequentially depositing a plurality of layer on said substrate by PECVD (Plasma Enhanced Chemical Vapor Deposition) in a showerhead reactor having a gas dispersion showerhead over said substrate, each layer having a thickness less than the final thickness of said film to be deposited, said final thickness being at least 20 microns and performing an etch clean of said reactor between the deposition of each layer of said thick to remove film build-up at least on said gas dispersion showerhead.

2. A method as claimed in claim 1, wherein said cleaning of the reactor is carried out in two steps comprising a first step wherein the entire reactor is cleaned, and a second step wherein said gas dispersion showerhead is cleaned to remove any film buildup thereon.

3. A method as claimed in claim 2, wherein said first step and second steps are carried out with an etchant in the presence of oxygen.

4. A method as claimed in claim 3, wherein said etchant is $C_2F_6$.

5. A method as claimed in claim 2, wherein said first step is carried out for a time dependent on the thickness of the previously deposited layer.

6. A method as claimed in claim 5, wherein the second step is carried out for a time dependent on the clean time for the first step.

7. A method as claimed in claim 2, wherein said first step is carried out at a higher pressure than said second step.

8. A method as claimed in claim 7, wherein said first step is carried out at a pressure of about 2.7 Torr and said second step is carried out at a pressure of about 0.7 Torr.

9. A method as claimed in claim 2, wherein the pressure in said first and second steps lies in the range 1 Torr to 10 Torr.

10. A method as claimed in claim 2, wherein after said second cleaning step, a wait period is inserted to permit the temperature of said reactor to stabilize.

11. A method as claimed in claim 2, wherein said gas dispersion head is also an electrode.

12. A method as claimed in claim 1, wherein the thickness of each layer deposited does not exceed 7 microns.

13. A method as claimed in claim 2, wherein the thick film is $SiO_2$.

* * * * *